(12) United States Patent
Hinsberg, III

(10) Patent No.: US 7,205,093 B2
(45) Date of Patent: Apr. 17, 2007

(54) TOPCOATS FOR USE IN IMMERSION LITHOGRAPHY

(75) Inventor: William Dinan Hinsberg, III, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/145,288

(22) Filed: Jun. 3, 2005

(65) Prior Publication Data

US 2006/0275704 A1 Dec. 7, 2006

(51) Int. Cl.
- G03F 7/16 (2006.01)
- G03F 7/20 (2006.01)
- G03F 7/11 (2006.01)
- G03F 7/30 (2006.01)

(52) U.S. Cl. ............... 430/273.1; 430/325; 430/326; 430/327; 430/330; 430/349; 430/935; 430/961

(58) Field of Classification Search ............ 430/273.1, 430/330, 349, 935, 961, 325, 326, 327
See application file for complete search history.

(56) References Cited

U.S. PATENT DOCUMENTS

| | | | |
|---|---|---|---|
| 5,366,855 A | 11/1994 | Anderson et al. | |
| 5,443,938 A | 8/1995 | Sakai | |
| 5,447,832 A | 9/1995 | Wang et al. | |
| 5,750,312 A | 5/1998 | Chandross et al. | |
| 5,858,604 A | 1/1999 | Takeda et al. | |
| 6,309,789 B1 | 10/2001 | Takano et al. | |
| 6,649,323 B2 | 11/2003 | Pappas et al. | |
| 6,764,806 B2 | 7/2004 | Jung et al. | |
| 2001/0003030 A1 | 6/2001 | Jung et al. | |
| 2002/0045121 A1 | 4/2002 | Higuchi et al. | |
| 2003/0162126 A1 | 8/2003 | Kitson et al. | |
| 2004/0048196 A1 | 3/2004 | Shao et al. | |
| 2005/0042554 A1* | 2/2005 | Dierichs et al. ............ 430/322 |
| 2005/0175940 A1* | 8/2005 | Dierichs ..................... 430/322 |

FOREIGN PATENT DOCUMENTS

JP          359191042 A        10/1984

OTHER PUBLICATIONS

Oikawa et al.; Effect of using a resin coating on KrF chemically amplified positive resists; SPIE vol. 1925; 0-8194-0827-Jan. 1993; pp. 92-100.

Kumada, et al.; Study on the over-top coating suppressing surface insoluble layer generation for chemical amplification resist; SPIE vol. 1925; 0-8194-0827-Jan. 1993; pp. 31-42.

(Continued)

Primary Examiner—Richard L. Schilling
(74) Attorney, Agent, or Firm—Schmeiser, Olsen & Watts; Daniel E. Johnson

(57) ABSTRACT

A method of forming a top coat layer and a topcoat material for use in immersion lithography. A topcoat layer is formed on a photoresist layer from an aqueous solution that is immiscible with the photoresist layer. The topcoat layer is then rendered insoluble in neutral water but remains soluble in aqueous-base developer solutions so the photoresist may be exposed in a immersion lithographic system using water as the immersion fluid, but is removed during photoresist development. The topcoat materials are suitable for use with positive, negative, dual tone and chemically amplified (CA) photoresist.

30 Claims, 5 Drawing Sheets

OTHER PUBLICATIONS

Ito, H.; Chemical amplification resists: History and development within IBM; IBM Journal of Research and Development, vol. 41, No. 1/2 Jan./Mar. 2000; 0018-8646/00; pp. 119-130.

MacDonald, et al.; Airborne Contaminations of a Chemically Amplified Resist; 1993 American Chemical Society; Chem. Mater., vol. 5, No. 3, 1993; 0897-4756/93/2805-0348; pp. 348-356.

Hinsberg, et al.; Liquid Immersion Lithography—Evaluation of Resist Issues; 13 pages.

Nalamasu, et al.; Preliminary Lithographic Characteristics of an All-organic Chemically Amplified Resist Formulation for Single Layer Deep-UV Lithography; SPIE vol. 1466 Advances in Resist Technology and Processing VIII; 1991; 0-8194-0565-May 1991; pp. 13-25.

Lin, B.; The Future of Subhalf-Micrometer Optical Lithography; 1987, Elsevier Science Publishers B.V. (North-Holland); Microelectronic Engineering 6; 0167-9317/87; pp. 31-51.

Havard, et al.; The Design and Study of Water-Soluble Positive- and Negative- Tone Imaging Materials; SPIE vol. 3333; 1998; pp. 111-121.

* cited by examiner

TOPCOATS FOR USE IN IMMERSION LITHOGRAPHY

FIELD OF THE INVENTION

The present invention relates to the field of integrated circuit fabrication; more specifically, it relates integrated circuit manufacture utilizing immersion photolithography technology.

BACKGROUND OF THE INVENTION

Immersion lithography is rapidly emerging as an important microelectronics fabrication technology. In immersion lithography a liquid is placed between the last optical element of the immersion lithography tool and photoresist layer. The optical properties of the liquid allow improved resolution and depth of focus to be attained. One key issue associated with immersion lithography is that the potential exists for photoresist degradation and for contamination of the optical components through leaching of photoresist components into the liquid layer. Topcoat materials applied over the resist layer are being examined as a means of suppressing this extraction.

Two types of topcoats currently exist. The first types of topcoats are water-insoluble requiring a topcoat stripping process prior to photoresist development. The second types of topcoats are water-insoluble but aqueous-base soluble which are readily removed during photoresist development but have the problem of tending to dissolve the photoresist layer and leave interfacial layers where the photoresist and topcoat layers were in contact.

Therefore, there is a continuing need for improved topcoat materials and methods of forming topcoat layers.

SUMMARY OF THE INVENTION

A topcoat layer is formed on a photoresist layer from a solution that is immiscible with the photoresist layer. The topcoat layer is then rendered insoluble in neutral water but remains soluble in aqueous-base developer solution so the photoresist may be exposed in a immersion lithographic system using water as the immersion fluid, but is removed during photoresist development. The topcoat materials are suitable for use with positive, negative, dual tone and chemically amplified (CA) photoresist.

A first aspect of the present invention is a method, comprising: forming a photoresist layer over a substrate; forming a precursor layer over a top surface of the photoresist layer, the precursor layer comprising a solution of an ionic form of a polymer and a solvent; and heating the precursor layer, the heating removing the solvent and converting the ionic form of the polymer to a non-ionic form of the polymer, the non-ionic form of the polymer being insoluble in water and soluble in aqueous-base solution.

A second aspect of the present invention is a method of forming an image in photoresist, comprising: forming a photoresist layer over a substrate; forming a precursor layer over a top surface of the photoresist layer, the precursor layer comprising a solution of an ionic form of a polymer, a volatile base and water; removing the solvent and the volatile base and converting the ionic form of the polymer to a non-ionic form of the polymer, the non-ionic form of the polymer being insoluble in water and soluble in aqueous-base solution; exposing the photoresist layer to actinic radiation through a photomask having opaque and clear regions, the opaque regions blocking the actinic radiation and the clear regions being transparent to the actinic radiation, the actinic radiation changing the chemical composition of regions of the photoresist layer exposed to the radiation forming exposed and unexposed regions in the photoresist layer; and removing either the exposed regions of the photoresist layer or the unexposed regions of the photoresist layer.

A third aspect of the present invention is a topcoat composition, comprising: a polymer of the structure:

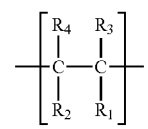

where $R_1$ is selected from the group consisting of a carboxylic acid group having 1 to 4 carbons, $R_2$ is an alkyl ester group of the form —CO—O—R' where R' is an alkyl group having 1 to 4 carbon atoms and $R_3$ and $R_4$ are each independently selected from the group consisting of hydrogen, a linear alkyl group having 1–6 carbon atoms, a branched alkyl group having 2–12 carbon atoms, an alicyclic group having 3–8 carbon atoms, an alkyl ester group having 2 to 5 carbon atoms, an alkyl ether group having 2 to 8 carbon atoms, and a fluorinated alcohol group having 1–12 carbon atoms; a material selected from the group consisting of $NH_3$, $CH_3NH_2$, $(CH_3)_2NH$, $(CH_3)_3N$, $CH_3CH_2NH_2$, $(CH_3CH_2)_2NH$, $(CH_3CH_2)_3N$, other amines and combinations thereof; and water.

A fourth aspect of the present invention is a topcoat composition, comprising: a polymer of the structure:

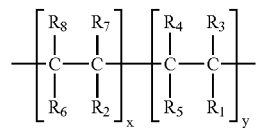

where $R_1$ is selected from the group consisting of a carboxylic acid group having 1 to 4 carbons, $R_2$ is an alkyl ester group of the form —CO—O—R' where R' is an alkyl group having 1 to 4 carbon atoms and $R_3$, $R_4$, $R_5$, $R_6$, $R_7$ and $R_8$ are each independently selected from the group consisting of hydrogen, a linear alkyl group having 1–6 carbon atoms, a branched alkyl group having 2–12 carbon atoms, an alicyclic group having 3–8 carbon atoms, an alkyl ester group having 2 to 5 carbon atoms, an alkyl ether group having 2 to 8 carbon atoms, and a fluorinated alcohol group having 1–12 carbon atoms; a material selected from the group consisting of $NH_3$, $CH_3NH_2$, $(CH_3)_2NH$, $(CH_3)_3N$, $CH_3CH_2NH_2$, $(CH_3CH_2)_2NH$, $(CH_3CH_2)_3N$, other amines and combinations thereof; and water.

A fifth aspect of the present invention is a topcoat composition, comprising: a polymer selected from the group consisting of poly(isobornyl methacrylate-co-methyl methacrylate-co-tert-butyl methacrylate-co-methacrylic acid) copolymer, poly(methyl methacrylate-co-methacrylic acid) copolymer and combinations thereof; ammonia; and water.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
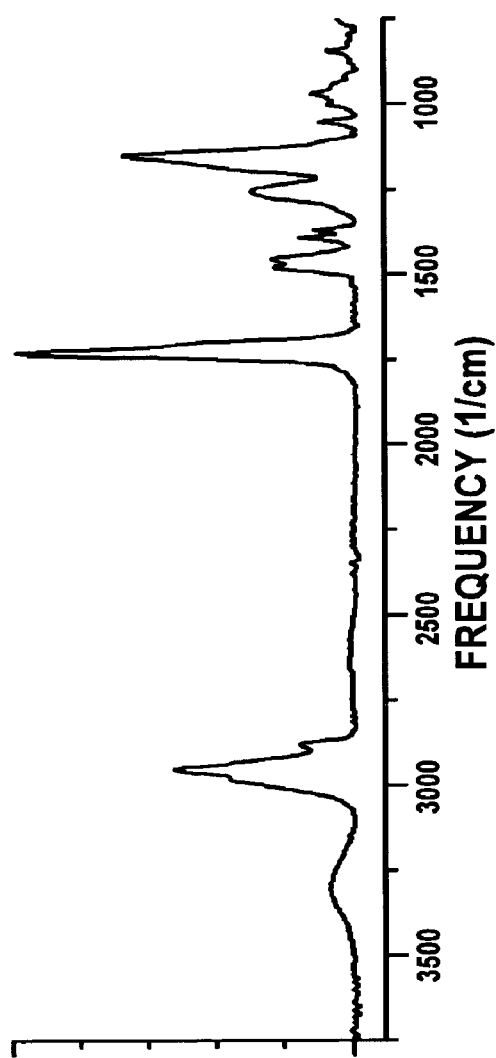
FIG. 1A is an infrared spectrum of a topcoat layer prepared according to an embodiment of the present invention and FIG. 1B is an infrared spectrum of a topcoat layer prepared by a control method.

Topcoat layers according to embodiments of the present invention may advantageously have the following solubility properties: (1) the topcoat layer does not dissolve or swell the underlying photoresist layer during application; (2) the topcoat layer is insoluble in neutral water during immersion exposure; and (3) the topcoat layer is soluble in aqueous-base during development. Neutral water is defined as water having a pH of between 6 and about 8. Topcoat layers according to the embodiments of the present invention are applied from an aqueous-base solution as polymers having pendent ionic groups. The topcoat layers may be applied, for example, by spin-coating. During evaporation of water during spinning and/or during an optional post-apply heating step (post bake), the pendent ionic groups undergo conversion to a neutral form. The neutral form renders the polymers insoluble in water. However, the neutral form retains its intrinsic solubility in aqueous-base so during photoresist development in aqueous-base developers the topcoat layer is removed without the need for a separate topcoat stripping step prior to photoresist development.

Topcoat layers of embodiments of the present invention may comprise acrylic polymers or copolymers having exemplary structures (I) or (II):

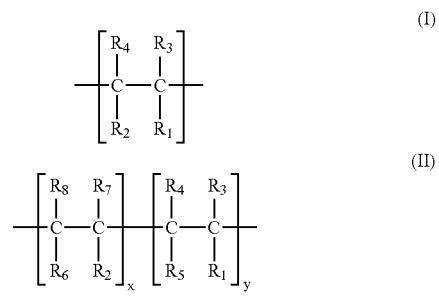

where $R_1$ is selected from the group consisting of a carboxylic acid group having 1 to 4 carbons, $R_2$ is an alkyl ester group of the form —CO—O—R' where R' is an alkyl group having 1 to 4 carbon atoms and $R_3$, $R_4$, $R_5$, $R_6$, $R_7$ and $R_8$ are each independently selected from the group consisting of hydrogen, a linear alkyl group having 1–6 carbon atoms, a branched alkyl group having 2–12 carbon atoms, an alicyclic group having 3–8 carbon atoms, an alkyl ester group having 2 to 5 carbon atoms, an alkyl ether group having 2 to 8 carbon atoms, and a fluorinated alcohol group having 1–12 carbon atoms.

The $R_1$ pendent group is an acid group selected to ionize (disassociate from its acidic —H group, thereby increasing its polarity) in a basic aqueous solution (a solution having a pH greater than about 11) and revert to its neutral (less polar, associated, un-ionized) acid form upon removal of the base from solution. For example, if the pendent group is —COOH in its neutral state, in the presence of $NH_3$ the pendent group would react with $NH_3$ in aqueous solution to form —COO$^-$ and $NH_4^+$ ions rendering the polymer soluble. Heat would drive off the $NH_3$ and reconstitute the —COOH pendent group, rendering the polymer insoluble in neutral or acidic aqueous solutions. The $R_1$ pendent group should be substantially transparent to the actinic radiation used by the immersion lithography system to expose the photoresist layer. The $R_1$ pendent group should not react with the photoresist layer in a manner to adversely affect the imaging quality of the photoresist layer.

The $R_2$, $R_3$, $R_4$, $R_5$, $R_6$, $R_7$ and $R_8$ pendent groups that are not H should cause the polymer/copolymer to be insoluble in water when the $R_1$ pendent group is not ionized. The $R_2$, $R_3$, $R_4$, $R_5$, $R_6$, $R_7$ and $R_8$ pendent groups should be substantially transparent to the actinic radiation used by the immersion lithography system to expose the photoresist layer. The $R_2$, $R_3$, $R_4$, $R_5$, $R_6$, $R_7$ and $R_8$ pendent groups should not react with the photoresist layer in a manner to adversely affect the imaging quality of the photoresist layer. The $R_2$, $R_3$, $R_4$, $R_5$, $R_6$, $R_7$ and $R_8$ pendent groups should not react with the $R_1$ pendent group.

Topcoat solutions according to this embodiment of present invention may comprise water solutions of polymer (I) or polymer (II) and a volatile base such as $NH_3$, $CH_3NH_2$, $(CH_3)_2NH$, $(CH_3)_3N$, $CH_3CH_2NH_2$, $(CH_3CH_2)_2NH$, $(CH_3CH_2)_3N$, other amines and combinations thereof.

The topcoat is formed by applying the topcoat solution to a photoresist layer to form a precursor layer, heating the precursor layer to drive off any residual water and the volatile base and convert the polymer (I) or polymer (II) to its non-water soluble but aqueous-base soluble form.

EXPERIMENTAL

First Preparation

A 4% by weight aqueous solution of the ionic form of the copolymer poly(isobornyl methacrylate-co-methyl methacrylate-co-tert-butyl methacrylate-co-methacrylic acid) (IBM-MMA-TBMA-MAA), 25:30:10:35 mole % ratio (hereinafter polymer III) was prepared by combining 480 mg of the carboxylic acid form of polymer III, 12 ml of water and 9/20 ml of concentrated (29% by weight) ammonium hydroxide.

As the following reactions show, the carboxylic acid form of polymer III (which is insoluble in neutral water) reacts with $NH_4OH$ in $H_2O$ to form the ionized and water soluble form of polymer III. The ionized form of polymer III may be converted back to the carboxylic acid form by heating the ionized form of polymer III to drive off $NH_3$.

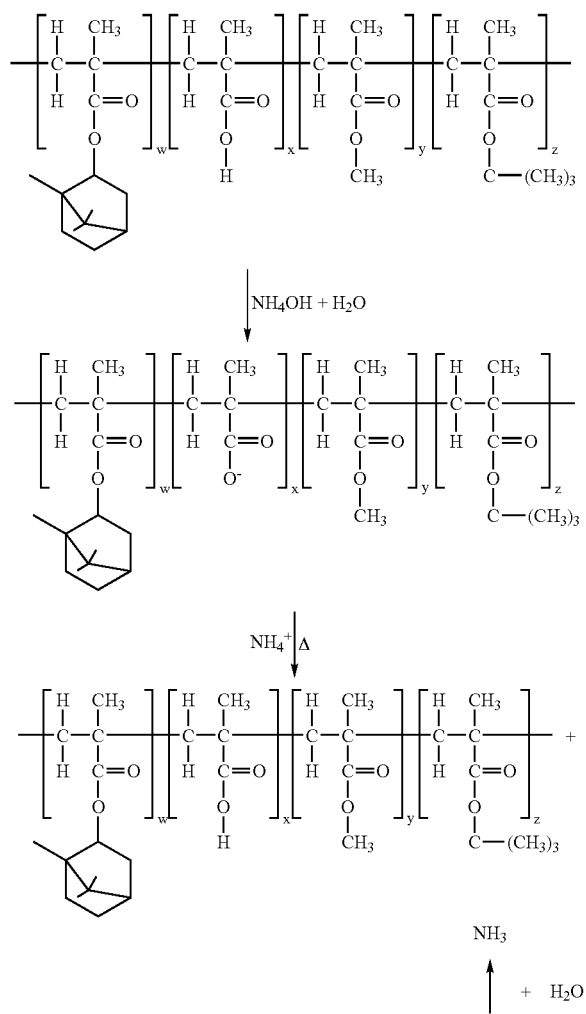

In the absence of ammonium hydroxide, the carboxylic acid form of polymer III is insoluble in neutral water, but by adding ammonium hydroxide the polymer is solubilized by ionization of the carboxylic acid groups, to yield a clear, colorless solution.

Figure 1B:
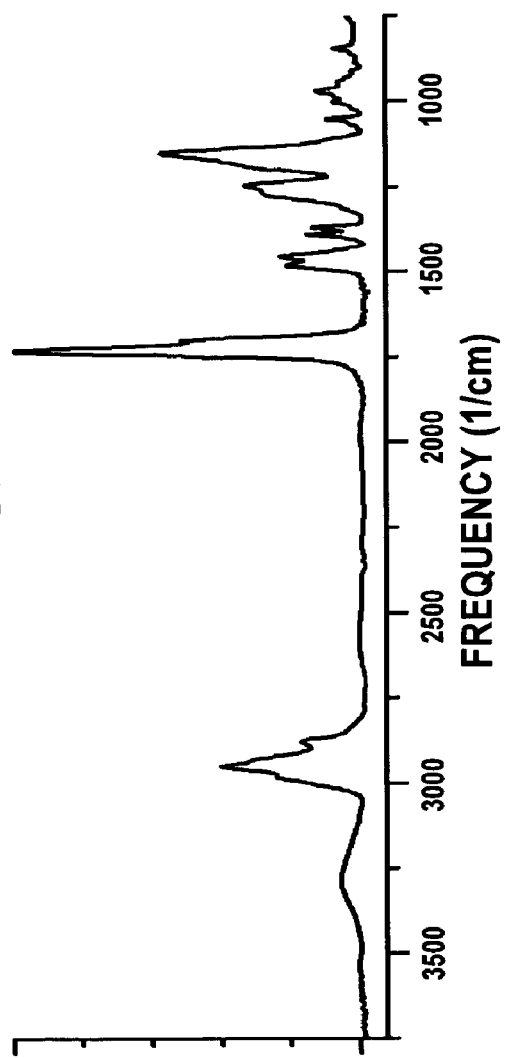

1/20 ml of the 4% by weight aqueous solution of the ionic form of IBM-MMA-TBMA-MAA was applied on a silicon wafer, and the resulting layer was heated at 110° C. for 90 seconds. An infrared spectrum of the resulting layer was recorded and is shown in FIG. 1A. For comparison purposes FIG. 1B is an infrared spectrum of a layer of the carboxylic acid form of IBM-MMA-TBMA-MAA made by dissolving the carboxylic acid form of IBM-MMA-TBMA-MAA in propylene glycol methyl ether acetate solvent, spin-applied to a silicon wafer, and baked at 110° C. for 90 seconds. The infrared spectra of FIGS. 1A and 1B are a very close match, indicating the starting material has been reconstituted. The presence of substantial amounts of carboxylate ion would be indicated in FIG. 1A by the presence of an absorption band in the 1610–1550 $cm^{-1}$ region which is not present.

Two experiments using polymer III based topcoat material were conducted.

Figure 2A:
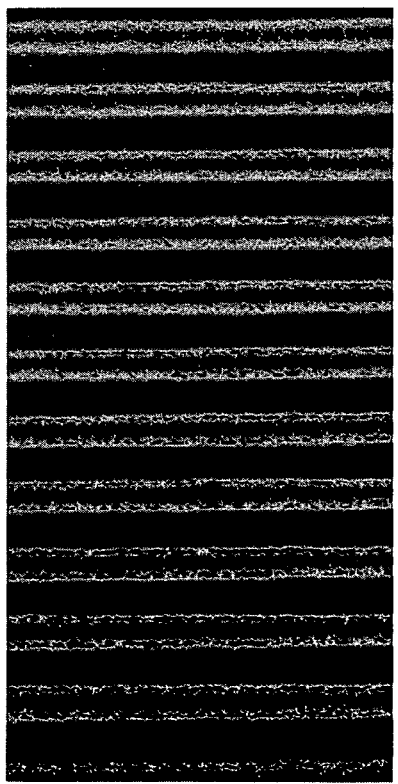
FIG. 2A is a top view and FIG. 2B is a sectional view of the line-space array that results after post-expose bake and development of a photoresist layer in aqueous-base developer of a control sample of a first experiment.

For a control sample in the first experiment, an antireflection layer of AR3-600 manufactured by Rohm and Haas Electronic Materials, Marlborough, Mass. was formed on a first silicon wafer. A 100 nm thick layer of TOK ILPEM01, a CA photoresist manufactured by Tokyo Ohka Kogyo, Kanagawa, Japan and designed for immersion lithography, was formed on top of the antireflection layer. After baking the photoresist layer, the wafer was exposed using a liquid immersion interferometric lithography system operating at a wavelength of 257 nm to form a series of line-space arrays of 180 nm pitch. Water was used as the immersion fluid. FIG. 2A is a top view and FIG. 2B is a sectional view of the line-space array that results after post-expose bake and development of the photoresist layer in aqueous-base developer of the control sample, both taken by scanning electron microscopy (SEM).

Figure 3A:
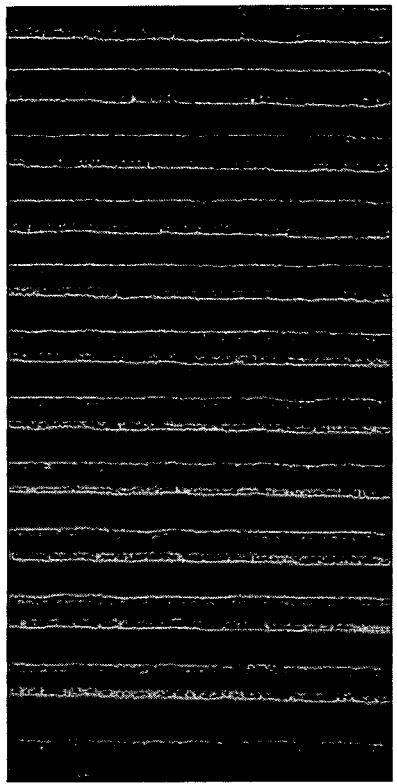
FIG. 3A is a top view and FIG. 3B is a sectional view of the line-space array that results after post-expose bake and development of a photoresist layer in aqueous-base developer of an experimental sample of the first experiment.

For an experimental sample in the first experiment, an antireflection layer of AR3-600 was formed on a second silicon wafer. A 100 nm thick layer of TOK ILPEM01 photoresist, was formed on top of the antireflection layer. After post-apply baking the photoresist layer but prior to exposure, a precursor topcoat layer was formed using the aqueous solution of the ionized form of polymer III described supra, on top of the photoresist layer. After application of the topcoat layer, the wafer was subjected to a topcoat post-apply bake at 110° C. for 90 seconds. After baking the wafer, the wafer was exposed using a liquid immersion interferometric lithography system operating at a wavelength of 257 nm to form a series of line-space arrays of 180 nm pitch. Water was used as the immersion fluid. FIG. 3A is a top view and FIG. 3B is a sectional view of the line-space array that results after post-expose bake and development of the photoresist layer in aqueous-base developer of the experimental sample, both taken by SEM.

Figure 3B:
Figure 2B:

By comparing FIG. 2A with FIG. 3A and FIG. 2B with FIG. 3B, it can be seen that images formed with a topcoat of an embodiment according to the present invention are comparable in quality to those formed without a topcoat, and the photoresist photosensitivity is essentially unchanged. Both these characteristics indicate that application of the topcoat solution has not caused significant base contamination of the underlying photoresist layer. It should be understood that CA resists are extremely sensitive to base contamination, especially ammonia and amine based bases.

Figure 4A:
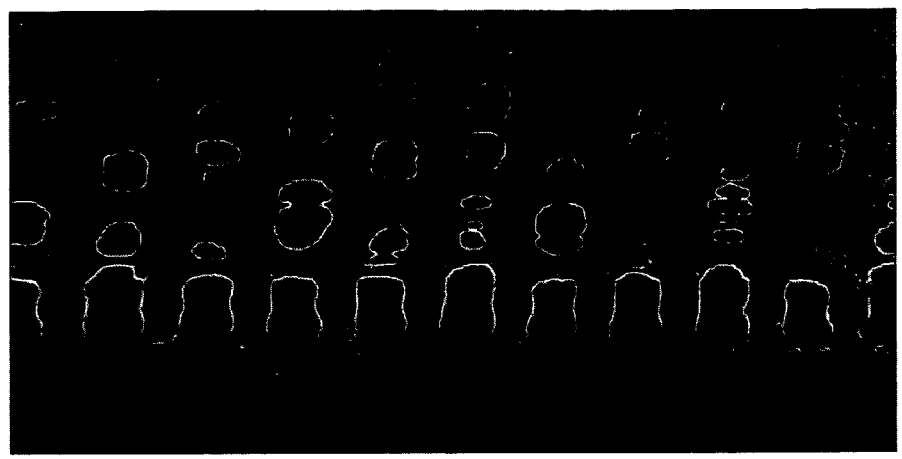
FIG. 4A is a sectional view of the line-space array that results after post-expose bake and development of a photoresist layer in aqueous-base developer of a first control sample of a second experiment.

For a first control sample in the second experiment, an antireflection layer of AR3-600 was formed on a first silicon wafer. A 150 nm thick layer of TOK P6111, a CA photoresist manufactured by Tokyo Ohka Kogyo, Kanagawa, Japan and useful for immersion lithography, was formed on top of the antireflection layer. No topcoat was applied. After post-apply baking the photoresist layer, the wafer was exposed in air (not under liquid immersion) using an interferometric lithography system operating at 257 nm wavelength to image a series of line-space arrays with 180 nm pitch. FIG. 4A is a sectional view of the line-space array that results after post-expose bake and development of the photoresist layer in aqueous-base developer of the first control sample taken by SEM. The webbing between adjacent lines is a consequence of airborne basic contamination present in the process environment.

Figure 4B:
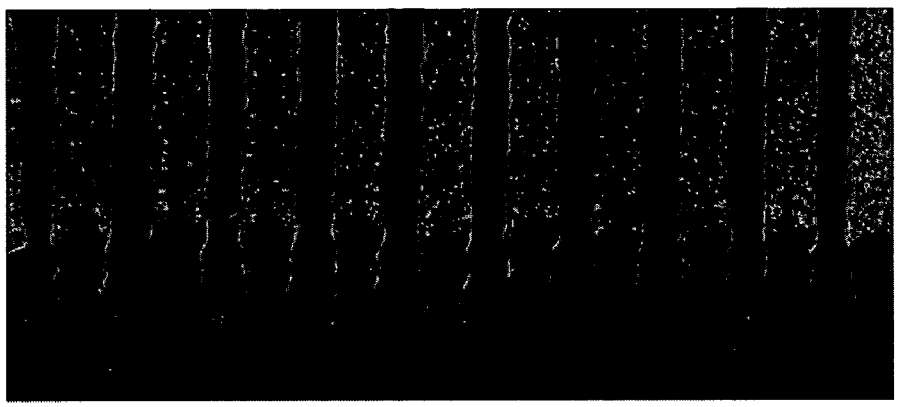
FIG. 4B is a sectional view of the line-space array that results after post-expose bake, removal of a topcoat layer, and development of a photoresist layer in aqueous-base developer of a second control sample.

For a second control sample in the second experiment, an antireflection layer of AR3-600 was formed on a second silicon wafer. A 150 nm thick layer of TOK P6111 photoresist was formed on top of the antireflection layer. After post-apply baking of the photoresist layer, a layer of TOK TSP-3A fluoropolymer topcoat manufactured by Tokyo Ohka Kogyo, Kanagawa, Japan was applied on top of the antireflective layer and post-apply baked at 90° C. for 60 seconds. The wafer was exposed in air (not under liquid immersion) using an interferometric lithography system operating at 257 nm wavelength to form a series of line-space arrays with 180 nm pitch. FIG. 4B is a sectional view of the line-space array that results after post-expose bake, removal of the topcoat layer with a proprietary organic solvent stripper, and development of the photoresist layer with aqueous-base developer of the second control sample taken by SEM. The webbing that was present in FIG. 4A is absent, a consequence of the protective benefit of the topcoat layer against airborne basic contamination present in the environment.

Figure 4C:
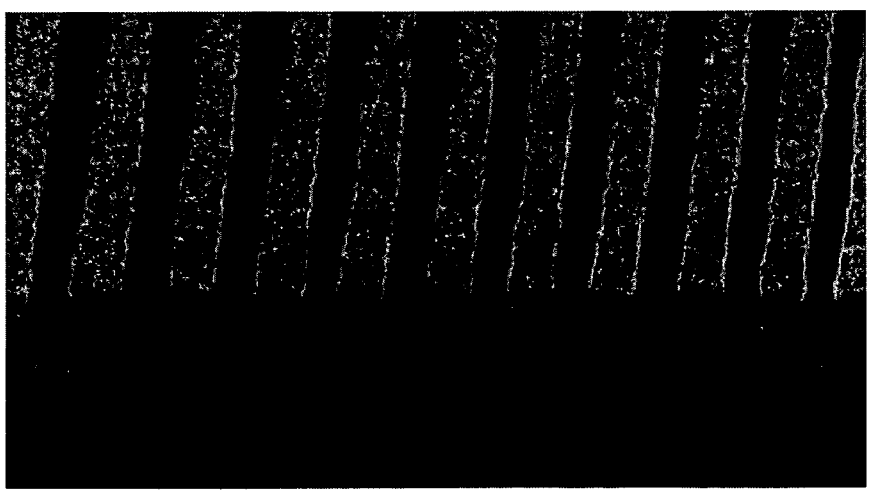
FIG. 4C is a sectional view of the line-space array that results after post-expose bake and development of a photoresist layer in aqueous-base developer of an experimental sample of the second experiment.

For a experimental sample in the second experiment, an antireflection layer of AR3-600 was formed on a third silicon wafer. A 150 nm thick layer of TOK P6111 photoresist was formed the antireflection layer. After post-apply baking the photoresist layer but prior to exposure, a topcoat layer was formed using the aqueous solution of the ionized form of polymer III described supra, on top of the photoresist layer. After application of the topcoat layer, the wafer was subjected to a topcoat post-apply bake at 110° C. for 90 seconds. The wafer was exposed in liquid immersion mode using a liquid immersion interferometric lithography system operating at 257 nm wavelength to form a series of line-space arrays with 180 nm pitch. FIG. 4C is a sectional view of the line-space array that results after post-expose bake and development of a photoresist layer in aqueous-base developer of an experimental sample of the second experiment. The photoresist images of FIG. 4C are essentially identical to those of FIG. 4B. This serves to demonstrate that the carboxylic acid form of polymer III topcoat layer functions as a barrier layer and that application of the ionized form of polymer III containing $NH_3$ does not cause significant base contamination of the underlying photoresist layer nor is there any indication for the formation of an interfacial layer between topcoat and photoresist.

These two experiments have produced unexpected results because of the known sensitivity of CA photoresists to ammonia and organic amines, both Bronsted bases. A Bronsted base is a molecule that can accept a proton. A Bronsted acid is a molecule that can donate a proton. In a CA photoresist, a small quantity of a Bronsted acid is formed upon exposure of the photoresist layer to actinic radiation. In a subsequent thermal step this acid acts to catalyze a chemical reaction (typically an acidolysis or a cross-linking) to cause a large change in the solubility of the polymer in the exposed regions of the photoresist layer. The net effect of the acid catalysis is a large gain in the photosensitivity of the resist, but one drawback is that CA resists are sensitive to trace quantities of ammonia or amines (airborne bases) which disrupt the acid-catalyzed step by acid-base neutralization. Exposing a CA photoresist in air containing as little as 15 ppb is enough to render any photoresist patterns obtained useless.

Second Preparation

A 4 wt % solution of the ionic form of the copolymer poly(methyl methacrylate-co-methacrylic acid) (PMMA-MAA), 20 mole % methacrylic acid by NMR analysis, molecular weight 12800, polydispersity 1.83; (hereinafter polymer IV) was prepared by combining 160 mg of the polymer, 4 ml of water and 3/20 ml of concentrated (29%) ammonium hydroxide solution.

As the following reactions show, the carboxylic acid form of polymer IV (which is insoluble in neutral water) reacts with $NH_4OH$ in $H_2O$ to form the ionized and water soluble form of polymer IV. The ionized form of polymer IV may be converted to the carboxylic acid form by heating to drive off $NH_3$.

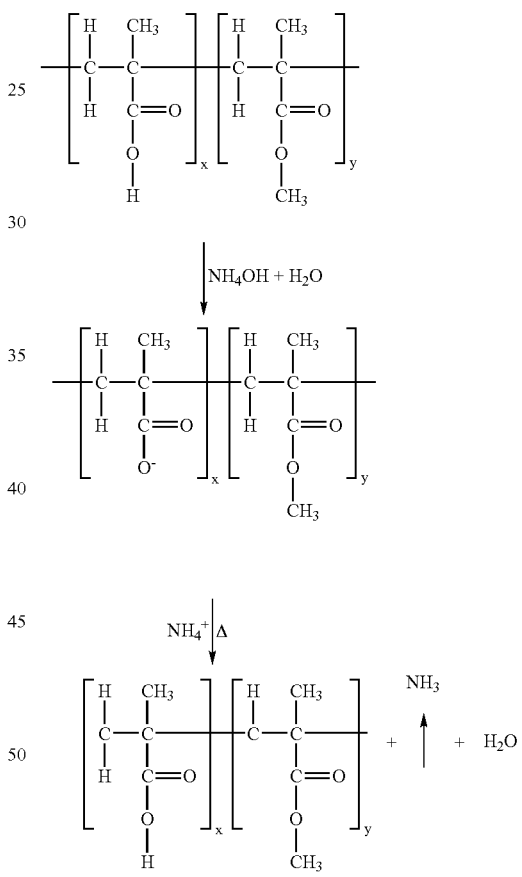

In the absence of the added ammonium hydroxide, the carboxylic acid form of polymer IV is insoluble in neutral water, but by adding ammonium hydroxide the polymer is solubilized by ionization of the carboxylic acid groups, to yield a clear, colorless solution.

A topcoat layer can be prepared from an aqueous solution of the ionic form of polymer IV by spin-coating, followed by a post-apply bake at 110° C. for 90 seconds. The resulting topcoat layer comprises the carboxylic acid form of polymer IV and is insoluble in neutral water but rapidly dissolves in 0.26 N tetramethyl ammonium hydroxide developer.

For a control sample, a deep ultraviolet antireflection layer was formed on a first silicon wafer. A 190 nm thick layer of JSR AR1682J, a CA photoresist manufactured by JSR Micro, Sunnyvale Calif. was formed on top of the antireflection layer. After baking the photoresist layer, the wafer was exposed by contact printing with broad-band 254 nm light using a step-wedge pattern mask to obtain a range of exposure doses between 7 and 18 mJ/cm$^2$ at the wafer plane. The photoresist layer was then post-expose-baked at 110° C. for 90 seconds to activate the resist imaging chemistry and developed for 30 seconds in CD-26 developer (a basic developer) manufactured by Rohm and Haas Electronic Materials, Marlborough, Mass.

For an experimental sample, a second silicon wafer was prepared and treated identically to the first silicon wafer with the exception that a layer of the ionic form of polymer IV was spin-coated and then baked at 110° C. for 90 seconds to drive out the ammonia and generate a layer of the carboxylic acid form of polymer IV on top of the photoresist layer. After baking the photoresist layer, the wafer was exposed by contact printing with broad-band 254 nm light using a step-wedge pattern mask to obtain a range of exposure doses between 7 and 18 mJ/cm$^2$ at the wafer plane. The photoresist layer was then post-expose-baked at 110° C. for 90 seconds to activate the resist imaging chemistry and developed in CD-26 developer for 30 seconds.

Both wafers showed well defined and fully developed relief patterns at the highest dose and partial development of patterns at lower doses. There was no significant difference in photoresist sensitivity between the two wafers apparent from this experiment.

Figure 5A:
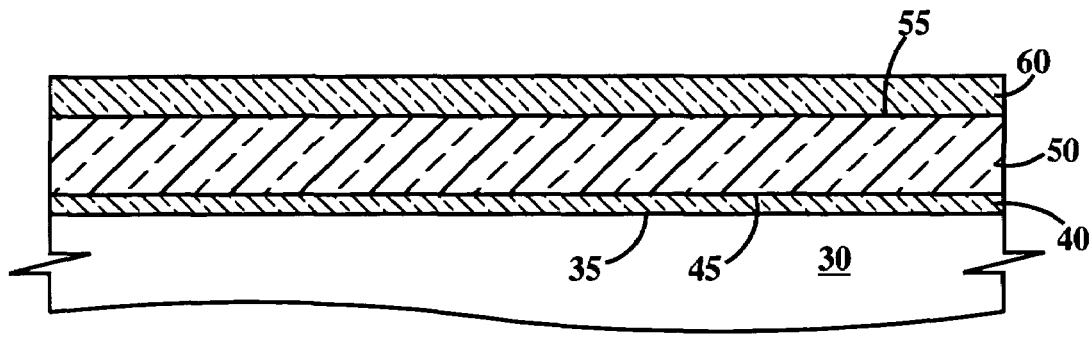
FIGS. 5A through 5C are partial cross-sectional views illustrating a semiconductor manufacturing process step according to an embodiment of the present invention.
Figure 5B:
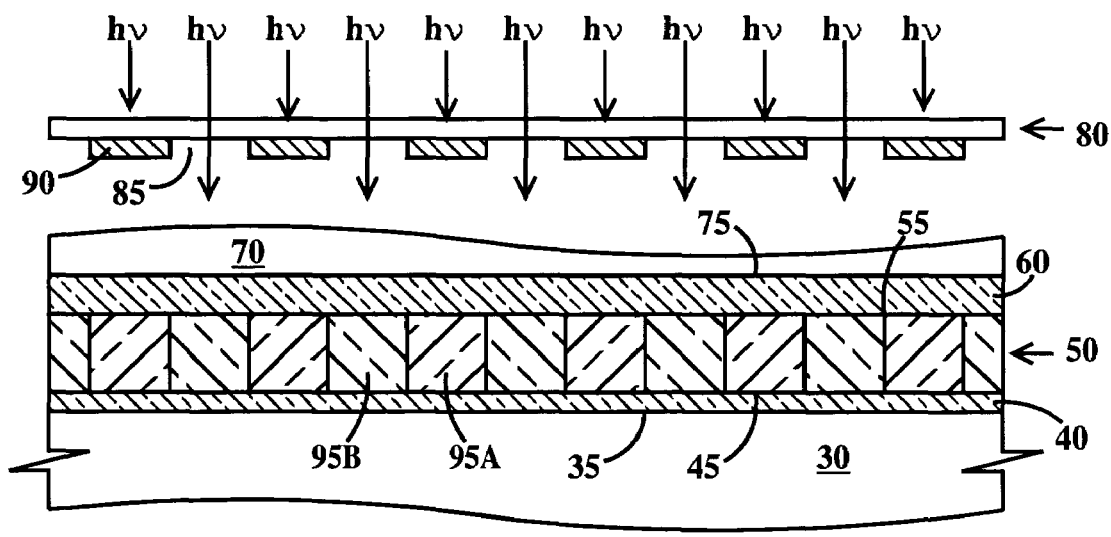
Figure 5C:
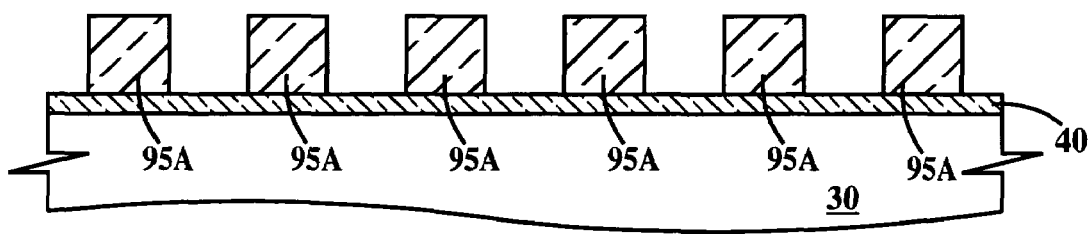

FIGS. 5A through 5C are partial cross-sectional views illustrating a semiconductor manufacturing process according to a embodiment of the present invention. In FIG. 5A, a substrate 30 is provided. In one example, substrate 30 is a semiconductor substrate. Examples of semiconductor substrates include but are not limited to bulk (single crystal) silicon wafers and silicon on insulator (SOI) wafers. Formed on a top surface 35 of substrate 30 is an optional antireflective coating (ARC) 40. In one example, ARC 40 is spin applied and a post ARC apply bake (heated above room temperature to remove most of the ARC solvent) performed. Formed on a top surface 45 of ARC 40 is a photoresist layer 50. In one example, photoresist layer 50 is spin applied and a post photoresist apply bake, also known as a pre-exposure bake or a pre-bake (heated above room temperature to remove most of the photoresist solvent) is performed. Next a topcoat 60 is formed on a top surface 55 of photoresist layer 50. Topcoat 60 comprises a carboxylic acid form of a polymer or copolymer as described supra. Topcoat 60 is spin applied from an aqueous solution containing a volatile base such as ammonia or an organic amine and a post topcoat apply bake (heated above room temperature to remove the water and drive out the volatile base) is performed and forms a topcoat layer that is not miscible with photoresist layer 50 or soluble in neutral water.

Figure 6:
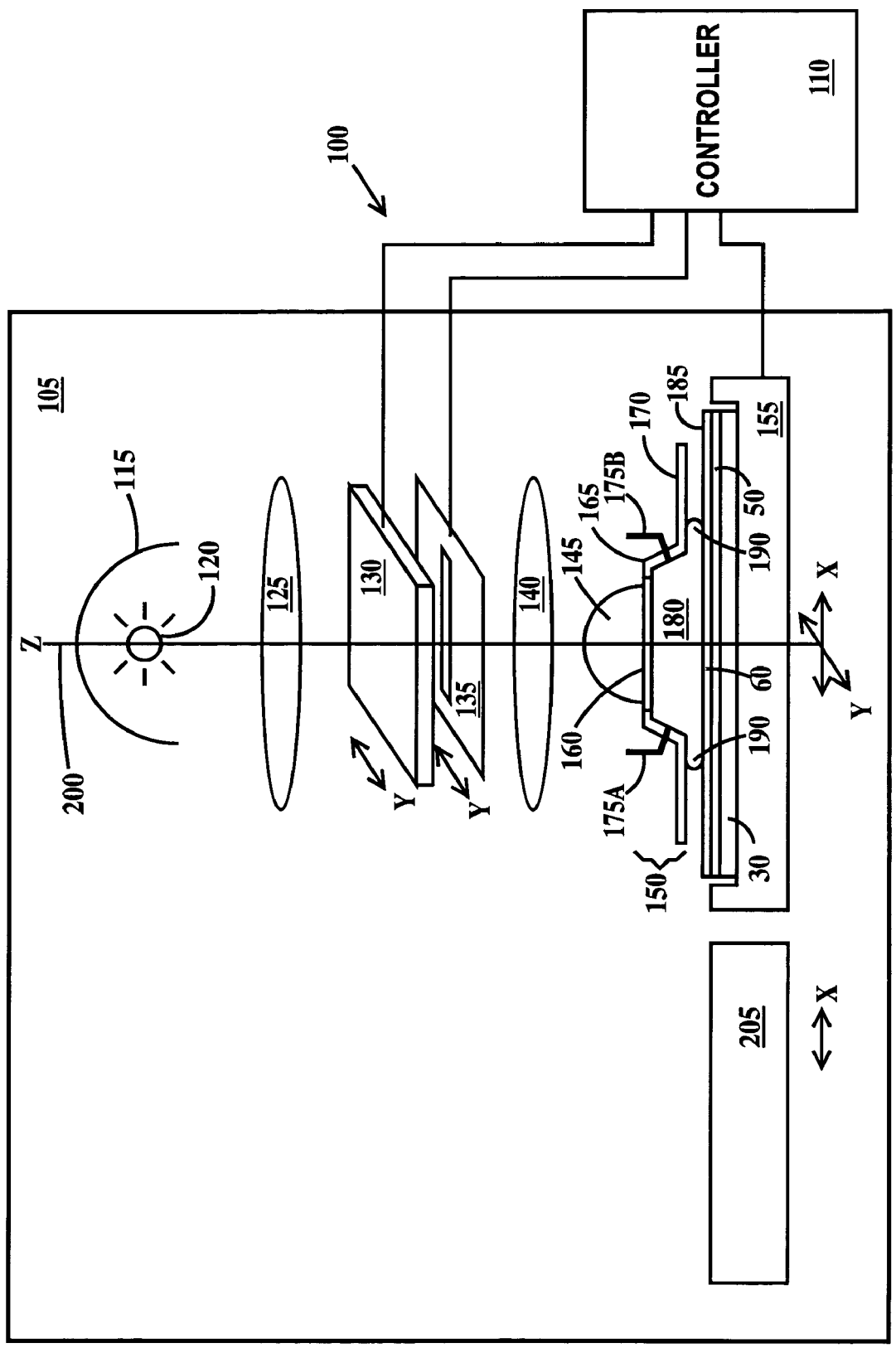
FIG. 6 is a diagram of an exemplary immersion photolithographic system that may be used to process a semiconductor wafer having a topcoat layer according to an embodiment of the present invention.

In FIG. 5B, a layer of immersion fluid 70 is formed over a top surface 75 of topcoat 60 in an immersion photolithography tool (see FIG. 6 and description infra). An example of an immersion fluid is water, with or without additives. Light of a wavelength to which photoresist layer 50 is sensitive is passed through a photomask 80. Photo mask 80 has clear regions 85 that transmit the light and opaque regions 90 that block the light. Exposure of photoresist layer 50 to light through mask 80 forms unexposed regions 95A of photoresist layer 50 and exposed regions 95B of photoresist layer 50. Exposed regions 95B are also known as latent image regions. An optional post exposure bake (heated above room temperature to drive the photoresist chemistry) may be performed.

Although a positive photoresist is shown in FIG. 5B, the embodiments of the present invention also work well with negative photoresist systems or dual tone photoresist systems. The embodiments of the present invention are well suited for use with chemically amplified resists. In negative photoresist systems, the photoresist will develop away where it is not exposed to light, so a photomask of polarity opposite to that illustrated in FIG. 5B is required. Dual tone resists can act either negatively or positively depending upon the developer system used.

In FIG. 5C, substrate 30 is removed from the immersion photolithography tool and photoresist layer 50 developed to remove exposed regions 95B (see FIG. 5B) and leave behind unexposed regions 95A. In one example the developer comprises an aqueous solution of a base such as tetramethyl ammonium hydroxide (TMAH). Topcoat 60 (see FIG. 5B) is also removed by the developer. An optional post development bake, (heated above room temperature to harden the photoresist images) may be performed.

While the exposure of the photoresist layer was described in the context of an immersion photolithography system, the topcoat compositions according to embodiments of the present invention also have utility in a conventional (non-immersion) photolithography system as illustrated by the comparison of FIGS. 6A and 6B described supra. The topcoats according to embodiments of the present invention may act as protective coatings against environmental contamination from volatile bases such as ammonia and organic amines that could degrade the imaging process or cause imperfections in the photoresist images and ultimately yield reliability defects in the fabricated product when the photoresist is a CA photoresist.

FIG. 6 is a diagram of an exemplary immersion photolithographic system that may be used to process a semiconductor wafer having a topcoat layer according to the present invention. In FIG. 6 an immersion lithography system 100 includes a controlled environment chamber 105 and a controller 110. Contained within controlled environment chamber 105 is a focusing mirror 115, a light source 120, a first focusing lens (or set of lenses) 125, a mask 130, an exposure slit 135, a second focusing lens (or set of lenses) 140, a final focusing lens 145, an immersion head 150 and a wafer chuck 155. Immersion head 150 includes a transparent window 160, a central chamber portion 165, a surrounding plate portion 170, an immersion fluid inlet 175A and an immersion fluid outlet 175B. An immersion fluid 180 fills central chamber portion 165 and contacts a top surface 185 of topcoat layer 60 formed on a top surface of photoresist layer 50 formed on a top surface of substrate 30. Topcoat layer 60 comprises a carboxylic acid form of a polymer or copolymer as described supra. Alternatively, an optional ARC layer may be formed between substrate 30 and photoresist layer 50. In one example, immersion fluid 180 includes water. Plate portion 170 is positioned close enough to topcoat layer 60 to form a meniscus 190 under plate portion 170. Window 160 must be transparent to the wavelength of light selected to expose photoresist layer 50.

Focusing mirror 115, light source 120, first focusing lens 125, a mask 130, exposure slit 135, second focusing lens 140, final focusing lens 145, immersion head 150 are all aligned along an optical axis 200 which also defines a Z direction. An X direction is defined as a direction orthogonal to the Z direction and in the plane of the drawing. A Y direction is defined as a direction orthogonal to both the X and Z directions. Wafer chuck 155 may be moved in the X and Y directions under the direction of controller 110 to allow formation of regions of exposed and unexposed photoresist in photoresist layer 50. As wafer chuck 155 moves, new portions of photoresist layer 50 are brought into contact with immersion fluid 180 and previously immersed portions of the photoresist layer are removed from contact with the immersion fluid. Mask 130 and slit 135 may be moved in the Y direction under the control of controller 110 to scan the image (not shown) on mask 130 onto photoresist layer 50. In one example, the image on mask 130 is a 1× to a 10× magnification version of the image to be printed and includes one or multiple integrated circuit chip images.

When exposure is complete, substrate 30 is removed from controlled environment chamber 105 without spilling immersion fluid 185. To this end, controlled environment chamber 105 also includes a cover plate 205 that may be moved to first abut with wafer chuck 155 and then moved with the wafer chuck as the wafer chuck is moved out of position from under immersion head 150, the cover plate replacing the wafer chuck under immersion head 150.

The topcoat compositions according to embodiments of the present invention may be used with other types of immersion lithography tools, an example of which is an immersion lithography tool wherein the immersion fluid is dispensed onto the wafer from openings in the lens barrel surrounding the lens.

Thus the embodiments of the present invention provide improved topcoat materials and methods of forming topcoat layers to wit, the topcoat layers according to embodiments of the present invention have the advantages that they can be formed from aqueous solution thus avoiding layer intermixing with the photoresist layer, are insoluble in water during immersion exposure thus remaining intact and of constant thickness throughout the entire photoresist exposure process, and are completely removed during the photoresist development step thus avoiding the need for a separate pre-photoresist develop topcoat removal step.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   forming a photoresist layer over a substrate;
   forming a precursor layer over a top surface of said photoresist layer, said precursor layer comprising a solution of an ionic form of a polymer and a solvent; and
   heating said precursor layer, said heating removing said solvent and converting said ionic form of said polymer to a non-ionic form of said polymer, said non-ionic form of said polymer being insoluble in water and soluble in aqueous-base solution.

2. The method of claim 1, wherein said polymer is organic and said solvent is water.

3. The method of claim 1, further including:
   forming an immersion layer comprising water on a top surface of said polymer, said polymer being in said non-ionic form; and
   exposing said photoresist layer to actinic radiation through said immersion layer and said polymer.

4. The method of claim 1, wherein said photoresist layer comprises a chemically amplified photoresist and said solvent comprises water.

5. The method of claim 4, wherein said solution further includes a volatile base and said heating removes said volatile base from said precursor layer.

6. The method of claim 4, wherein:
   said polymer includes an acrylic polymer containing pendent ionic groups, said pendent groups are thermally labile, and said heating modifies said acrylic polymer to produce a modified acrylic polymer that is insoluble in water but soluble in aqueous-base solution.

7. The method of claim 6, wherein the pendent ionic groups include carboxylic acid.

8. The method of claim 1, wherein the starting polymer includes ionic pendent groups that are rendered non-ionic as a result of said heating.

9. The method of claim 8, wherein the ionic pendent groups are formed by mixing said polymer with ammonia.

10. The method of claim 1, wherein said polymer includes monomers having the structure:

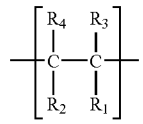

where $R_1$ is selected from the group consisting of a carboxylic acid group having 1 to 4 carbons, and $R_2$, $R_3$ and $R_4$ are each independently selected from the group consisting of hydrogen, a linear alkyl group having 1–6 carbon atoms, a branched alkyl group having 2–12 carbon atoms, an alicyclic group having 3–8 carbon atoms, an alkyl ester group having 2 to 5 carbon atoms, an alkyl ether group having 2 to 8 carbon atoms, and a fluorinated alcohol group having 1–12 carbon atoms.

11. The method of claim 10, wherein said solution includes a material selected from the group consisting of $NH_3$, $CH_3NH_2$, $(CH_3)_2NH$, $(CH_3)_3N$, $CH_3CH_2NH_2$, $(CH_3CH_2)_2NH$, $(CH_3CH_2)_3N$, other amines and combinations thereof.

12. The method of claim 1, wherein said polymer includes a first monomer having the structure:

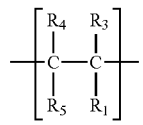

and a second monomer having the structure

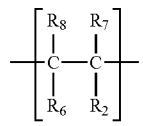

where $R_1$ is selected from the group consisting of a carboxylic acid group having 1 to 4 carbons, $R_2$ is an alkyl ester group of the form —CO—O—R' where R' is an alkyl group having 1 to 4 carbon atoms and $R_3$, $R_4$, $R_5$, $R_6$, $R_7$ and $R_8$ are each independently selected from the group consisting of hydrogen, a linear alkyl group having 1–6 carbon atoms, a branched alkyl group having 2–12 carbon atoms, an alicyclic group having 3–8 carbon atoms, an alkyl ester group having 2 to 5 carbon atoms, an alkyl ether group having 2 to 8 carbon atoms, and a fluorinated alcohol group having 1–12 carbon atoms.

13. The method of claim 12, wherein said solution includes a material selected from the group consisting of $NH_3$, $CH_3NH_2$, $(CH_3)_2NH$, $(CH_3)_3N$, $CH_3CH_2NH_2$, $(CH_3CH_2)_2NH$, $(CH_3CH_2)_3N$, other amines and combinations thereof.

14. The method of claim 1, wherein said polymer comprises a polymer selected from the group consisting of poly(isobornyl methacrylate-co-methyl methacrylate-co-tert-butyl methacrylate-co-methacrylic acid) copolymer, poly(methyl methacrylate-co-methacrylic acid) copolymer and combinations thereof.

15. The method of claim 14, wherein said solution includes ammonia.

16. A method of forming an image in photoresist, comprising:
    forming a photoresist layer over a substrate;
    forming a precursor layer over a top surface of said photoresist layer, said precursor layer comprising a solution of an ionic form of a polymer, a volatile base and a solvent;
    removing said solvent and said volatile base and converting said ionic form of said polymer to a non-ionic form of said polymer, said non-ionic form of said polymer being insoluble in water and soluble in aqueous-base solution;
    exposing said photoresist layer to actinic radiation through a photomask having opaque and clear regions, said opaque regions blocking said actinic radiation and said clear regions being transparent to said actinic radiation, said actinic radiation changing the chemical composition of regions of said photoresist layer exposed to said radiation forming exposed and unexposed regions in said photoresist layer; and
    removing either said exposed regions of said photoresist layer or said unexposed regions of said photoresist layer.

17. The method of claim 16, further including, forming an anti-reflective coating over a top surface of said substrate, wherein said photoresist layer is formed on a top surface of said anti-reflective coating.

18. The method of claim 16, further including, between said removing said solvent and said volatile base and said exposing said photoresist layer, forming a layer of immersion fluid between said topcoat layer and said photomask.

19. The method of claim 18, wherein said immersion fluid includes water.

20. The method of claim 19, wherein said solvent includes water.

21. The method of claim 18, wherein said removing either said exposed regions of said photoresist layer or said unexposed regions of said photoresist layer further includes removing said non-ionic form of said polymer.

22. The method of claim 18, wherein removing said solvent and said volatile base includes heating said precursor layer to a temperature above room temperature.

23. The method of claim 18, wherein said photoresist layer comprises a chemically amplified photoresist.

24. The method of claim 23, wherein said actinic radiation generates a Bronsted acid in portions of said photoresist layer exposed to said actinic radiation.

25. The method of claim 18, wherein said polymer includes monomers having the structure:

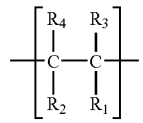

where $R_1$ is selected from the group consisting of a carboxylic acid group having 1 to 4 carbons, $R_2$ is an alkyl ester group of the form —CO—O—R' where R' is an alkyl group having 1 to 4 carbon atoms and $R_3$ and $R_4$ are each independently selected from the group consisting of hydrogen, a linear alkyl group having 1–6 carbon atoms, a branched alkyl group having 2–12 carbon atoms, an alicyclic group having 3–8 carbon atoms, an alkyl ester group having 2 to 5 carbon atoms, an alkyl ether group having 2 to 8 carbon atoms, and a fluorinated alcohol group having 1–12 carbon atoms.

26. The method of claim 25, wherein said solution includes a material selected from the group consisting of $NH_3$, $CH_3NH_2$, $(CH_3)_2NH$, $(CH_3)_3N$, $CH_3CH_2NH_2$, $(CH_3CH_2)_2NH$, $(CH_3CH_2)_3N$, other amines and combinations thereof.

27. The method of claim 18, wherein said polymer includes first monomer having the structure:

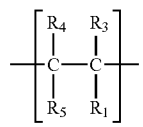

and a second monomer having the structure

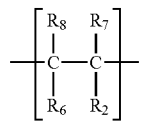

where $R_1$ is selected from the group consisting of a carboxylic acid group having 1 to 4 carbons, $R_2$ is an alkyl ester group of the form —CO—O—R' where R' is an alkyl group having 1 to 4 carbon atoms and $R_3$, $R_4$, $R_5$, $R_6$, $R_7$ and $R_8$ are each independently selected from the group consisting of hydrogen, a linear alkyl group having 1–6 carbon atoms, a branched alkyl group having 2–12 carbon atoms, an alicyclic group having 3–8 carbon atoms, an alkyl ester group having 2 to 5 carbon atoms, an alkyl ether group having 2 to 8 carbon atoms, and a fluorinated alcohol group having 1–12 carbon atoms.

28. The method of claim 27, wherein said solution includes a material selected from the group consisting of $NH_3$, $CH_3NH_2$, $(CH_3)_2NH$, $(CH_3)_3N$, $CH_3CH_2NH_2$, $(CH_3CH_2)_2NH$, $(CH_3CH_2)_3N$, other amines and combinations thereof.

29. The method of claim 18, wherein said polymer comprises a polymer selected from the group consisting of poly(isobornyl methacrylate-co-methyl methacrylate-co-tert-butyl methacrylate-co-methacrylic acid) copolymer, poly(methyl methacrylate-co-methacrylic acid) copolymer and combinations thereof.

30. The method of claim 29, wherein said solution includes ammonia.

* * * * *